United States Patent [19]
Jaskolski et al.

[11] 4,112,458
[45] Sep. 5, 1978

[54] SILICON THYRISTOR SENSITIVE TO LOW TEMPERATURE WITH THERMAL SWITCHING CHARACTERISTICS AT TEMPERATURES LESS THAN 50° C

[75] Inventors: Stanley V. Jaskolski, Sussex; Robert W. Lade, Waukesha; Herman P. Schutten, Elm Grove; Gordon B. Spellman, Mequon, all of Wis.

[73] Assignee: Cutler-Hammer, Inc., Milwaukee, Wis.

[21] Appl. No.: 652,192

[22] Filed: Jan. 26, 1976

[51] Int. Cl.² .............................................. H01L 29/74
[52] U.S. Cl. ...................................... 357/38; 357/28; 357/39; 307/258; 307/310
[58] Field of Search ........................... 357/28, 38, 39; 307/258, 310

[56] References Cited

U.S. PATENT DOCUMENTS

| | | | |
|---|---|---|---|
| 2,996,918 | 8/1961 | Hunter | 73/362 |
| 3,079,484 | 2/1963 | Shockley et al. | 357/38 |
| 3,124,936 | 3/1964 | Melehy | 357/28 |
| 3,166,680 | 1/1965 | Kevane et al. | 307/258 |
| 3,268,780 | 8/1966 | Navon et al. | 357/28 |
| 3,513,363 | 5/1970 | Herlet | 357/38 |
| 3,896,369 | 7/1975 | Nakata | 307/310 |
| 3,920,955 | 11/1975 | Nakata | 307/252 B |
| 3,959,621 | 5/1976 | Nakata | 219/501 |
| 3,962,692 | 6/1976 | Murphy et al. | 357/28 |
| 3,971,056 | 7/1976 | Jaskolski et al. | 357/38 |

FOREIGN PATENT DOCUMENTS

| | | | |
|---|---|---|---|
| 2,446,104 | 4/1975 | Japan | 357/28 |
| 416,839 | 1/1967 | Switzerland | 357/38 |

OTHER PUBLICATIONS

M. Otsuka, "The Forward Characteristics of Thyristors," Proc. IEEE, vol. 55, #8, Aug. 1967, pp. 1400–1408.
W. Anheier et al., "Rigorous Numerical Analysis of a Planar Thyristor," IEDM, Dec. 1975, Washington, D.C., 4 pages.
W. Kapallo, "On-Char. of Planar SCR's with regard to the use of These Devices in Monolithic CKTs," S-S Electronics, vol. #11, pp. 437–444, 1968.
W. Fulop et al., "Three Terminal Gain Measurements of High-Power Thyristors," Int. J. Electronics, vol.33, #6, 1972, pp. 601–609.
W. Fulop, "Three Terminal Measurements of Current Amplification Factors of Controlled Rectifiers," IEEE Trans. on Elec. Dev., vol. 10, 1963, pp. 120–133.
K. Spangenberg, "Fundamentals of Electron Devices," McGraw-Hill Electrical and Electronic Engr. Series, 1957, p. 264.
F. Gentry et al.,"Semiconductor Controlled Rect.: Prin. and Appl. of P-N-P-N Devices," Prentice-Hall, N.J., 1964, pp. 134, 135.
C. Hogarth et al., "Measurement of Current Gains . . . Gold-Doping," Int. J. Electronics, vol. 37, #1, 1974, pp. 127–140.
P. Raderecht et al., "The Temp. Var. of the Parameters of Si Controlled Rectifiers," J. Electronic Control, vol. 17, #10, pp. 145–157, 1964.
D. Muss et al., "Switching Mechanism in the N-P-N-P Silicon Controlled Rect.," IEEE Trans. on Elec. Dev., May 1963, pp. 113–120.
A. Dumanevich et al., "Some Features of the Temp. Dependence of the Static Turn-On Current of Thyristors," Physics of P-N Junctions and Semiconductor Devices (U.S.S.R.), S. Ryvhin et al. Editors, Consultants Bureau, N.Y., 1971, pp. 137–141.

*Primary Examiner*—Joseph E. Clawson, Jr.
*Attorney, Agent, or Firm*—Hugh R. Rather; William A. Autio; Michael E. Taken

[57] ABSTRACT

Thermally sensitive silicon thyristors capable of intrinsically switching between high and low resistance states in response to a predetermined temperature in the range −30° C to +150° C; this intrinsic switching temperature being not only lower than heretofore achieved but also predictably determinable. The two terminal breakover voltage is nominally equal to one-half Vmax at a temperature less than 50° C, where Vmax is the maximum value of the two terminal breakover voltage of the thyristor with respect to temperature.

14 Claims, 11 Drawing Figures

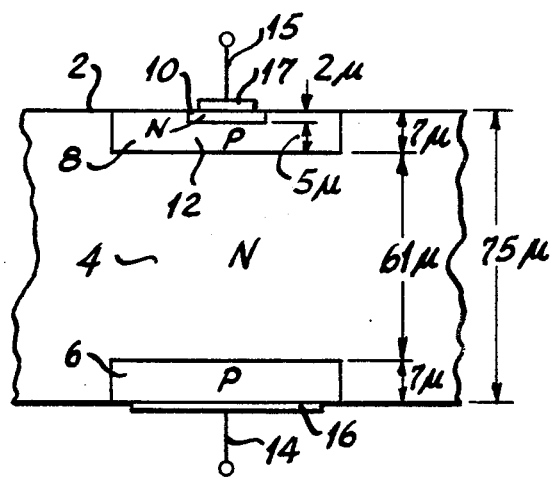
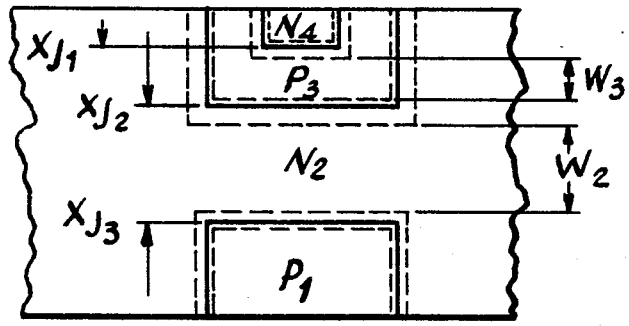
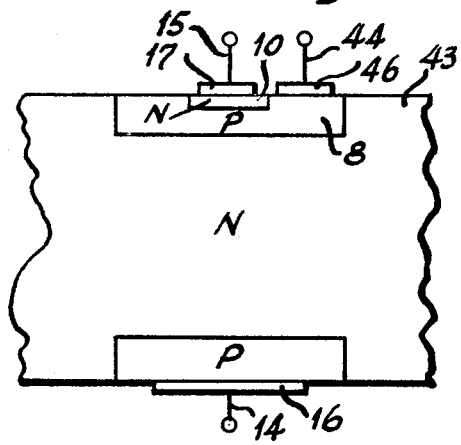
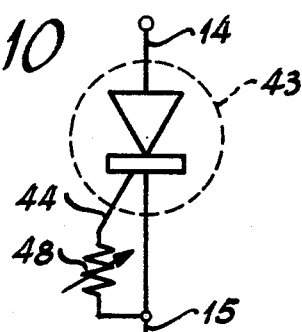
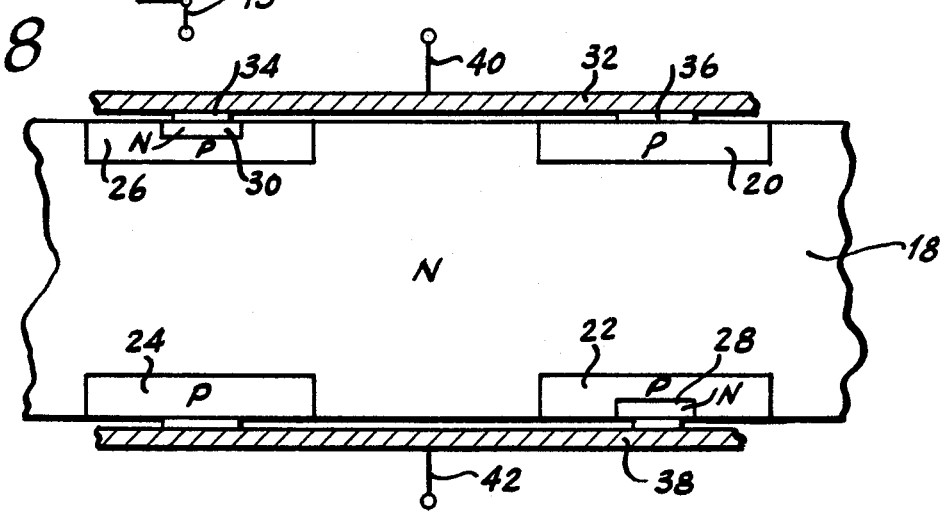

SILICON THYRISTOR SENSITIVE TO LOW TEMPERATURE WITH THERMAL SWITCHING CHARACTERISTICS AT TEMPERATURES LESS THAN 50° C

BACKGROUND OF THE INVENTIION

Heretofore, certain devices capable of switching between high and low resistance states have depended for their control upon signals provided by a separate sensing element in the circuit containing the device. In the case of semiconductor switches, it has been the practice to employ a separate temperature responsive control element in the circuit therewith to initiate the switching of the semiconductor switch between its high and low resistance states upon attainment of a given temperature level. The semiconductor switches frequently used are thyristors, such as semiconductor controlled rectifiers (SCR's) or Triacs.

The possibility of using temperature levels to control the switching of SCR's and related devices directly has been known for some time as disclosed in Shockley et al. U.S. Pat. No. 3,079,484, dated Feb. 26, 1963. With the exception of the S. V. Jaskolski et al. U.S. Pat. No. 3,971,056 issued July 20, 1976 and assigned to the assignee of this invention, practical uses for such teachings have not been realized, principally because the development of semiconductor devices has been in the opposite direction, that is, in the direction of preventing intrinsic switching below very high temperatures.

The Jaskolski et al. Patent discloses germanium semiconductor temperature responsive switches which are capable of intrinsically switching between high and low resistance states in response to a predetermined temperature level within the range −55° to +55° C.

Germanium is more sensitive to temperature changes than silicon, due to germanium's lower energy gap (energy region between the valence band and the conduction band). Germanium has a total energy gap of 0.75 eV (electron volt). Its density of intrinsic carriers doubles about every 15° C. Silicon, however, has a total energy gap of 1.12 eV so that its rate of change of density somewhat greater with temperature; but its intrinsic carrier density is smaller than that of germanium by more than a thousand so that it can be used to higher temperatures. Hence, germanium was the preferred choice in selecting a semiconductor material suitable for low temperature intrinsic switching capability. Silicon has heretofore been deemed unsuitable for such application.

Furthermore, germanium and silicon exhibit different intrinsic switching mechanisms. While germanium devices switch primarily because of the electric field in the base region, the phenomena predominantly responsive for the switching action of a four layer silicon device is associated with space charge recombination current (recombining of holes and electrons giving rise to a current flow). The value of the space charge recombination current is a function of the host material, carrier lifetimes, an effective carrier lifetime in the depletion region, impurity profiles and device geometry, as will be more fully described hereinafter.

The inherent temperature dependence of a silicon SCR is manifested in that with increasing temperature, the device leakage current increases and the forward breakover voltage decreases; wherein breakover voltage is defined as that value of applied voltage which causes the device to switch between a high resistance low current "off" state and a low resistance high current "on" state. The switching point of a four layer device is thus variable with device operating temperature, an undesirable result in a high power device dissipating power to produce self-heating thereby causing the switching point to continuously change with power dissipation level.

Since this temperature dependent effect is undesirable, manufacturers have developed techniques to reduce this temperature sensitivity. The approach has been to design a device wherein the temperature dependence of the breakover voltage is not manifested until an unobjectionably large temperature is reached, such as 165° C. The designs typically employ a "shorted-emitter" configuration accompanied by at least one large base region on the order of 4 to 8 mils in width. The shorted-emitter "shorts" out some of the thermally generated leakage current and hence decreases the thermal sensitivity of the device. A base region is made very wide with respect to a diffusion length to reduce the base transport efficiency and hence one of the alphas. Switching action will then occur at higher injection levels as the recombination centers tend toward saturation, thus effecting an increase of the minority carrier lifetime in the space charge region causing an increase in alpha, resulting in switching.

SUMMARY OF THE INVENTION

As used herein, "thyristor" shall mean a bistable semiconductor device comprising three or more junctions that can be switched from an off state to an on state and vice versa.

Unlike prior art developments, a goal of the present invention is to predictably increase the thermal sensitivity of silicon semiconductor devices in low temperature ranges whereby to afford semiconductor switches capable of intrinsically switching between high and low resistance states in response to a predetermined temperature. Thermal sensitivity may be enhanced by: (1) increasing the base transport efficiency (and hence one of the alphas), corresponding to a reduced base width, or equivalently, increased minority carrier diffusion length and increased carrier lifetime; and/or (2) increasing injection efficiency corresponding to low emitter resistivity with respect to base resistivity.

The current gain factor $\alpha$, defined as the ratio of change in collector current to change in emitter current at constant collector voltage, is proportional to the product of the emitter efficiency $\gamma$ and the base transport efficiency $\beta$, i.e. $\alpha = \gamma \cdot \beta$; where $\gamma$ is defined as the fraction of emitter junction current carried by holes (for a PNP transistor), and where $\beta$ is defined as the ratio of the collector hole current to the hole current injected into the base at the emitter. $\beta$ is proportional to sech (W/L); where W is the width of the base region and L is the minority carrier diffusion length. L is proportional to $(\tau D)^{\frac{1}{2}}$ where $\tau$ is the minority carrier lifetime and D is a diffusion constant. It is thus seen that $\beta$ increases as the quantity (W/L) decreases. (W/L) may be decreased by reducing the base width and/or by increasing the diffusion length. The diffusion length may be increased by maintaining a high minority carrier lifetime, $\tau$.

$\gamma$ is a function of current which is in turn a function of temperature, so that an increase in temperature causes an increase in $\gamma$ which in turn causes an increase in $\alpha$, resulting in switching. $\beta$ is relatively constant with respect to temperature, but can be increased by reducing the base width, increasing carrier lifetime, increasing minority carrier diffusion length, etc., thereby causing a greater $\alpha$ as $\gamma$ increases with temperature, thus resulting in switching at a lower temperature.

Unlike prior art thyristors, the present invention employes very narrow base widths with respect to diffusion lengths whereby to increase base transport efficiency and hence alpha.

Emitters are heavily doped and bases are lightly doped so as to provide emitters of low resistivity (high conductivity) relative to the bases whereby to increase injection efficiency and hence alpha.

The present invention exhibits an intrinsic switching temperature not only lower than heretobefore achieved but also predictably determinable.

It is therefore an object of the present invention to enhance the thermal sensitivity of silicon thyristors.

Another object of the invention is to provide a silicon thyristor wherein the temperature dependence of the breakover voltage is manifested in low temperature ranges.

Another object of the invention is to provide a temperature sensitive silicon thyristor thermally actuatable to intrinsically switch between high and low resistance stages in response to a predetermined temperature in the range $-30°$ to $+150°$ C.

Another object of the invention is to provide a thyristor of the aforementioned type whose instrinsic switching temperature may be predictably determined by the appropriate combination of values for the parameters of geometry, doping and carrier lifetime.

A still further object of the invention is to provide thyristors of the aforementioned type which can be used for directly controlling the energization and de-energization of equipments used in domestic, commercial and industrial environments, such as freezers, refrigerators, air conditioners and temperature control baths without need of additional temperature sensing devices and attendant circuitry.

A further object of the invention is to provide basic control circuitry, together with alternate device configurations and/or additional electrodes, where appropriate, for the aforementioned thyristors whereby their switching temperatures can be further adjusted and controlled as desired.

Other objects and advantages of the invention will hereinafter appear.

BRIEF DESCRIPTION OF THE DRAWINGS

FIG. 1 is a schematic showing a particular semiconductor temperature responsive switch constructed in accordance with the invention.

FIG. 2 is a schematic of a generic embodiment of the switch of FIG. 1.

FIG. 8 is a schematic of an alternate embodiment of the present invention showing a bilateral switch.

FIGS. 9 and 10 show a cathode gated switch and circuit application therefore.

DESCRIPTION OF THE PREFERRED EMBODIMENT

Figure 3:
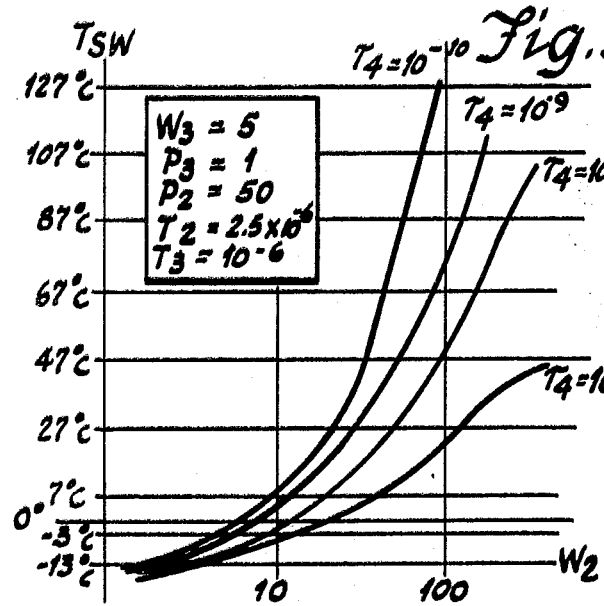
FIG. 3 is a graph showing the variation in switching temperature of the switch of FIG. 2 with respect to electrical width of region 2 therein for four different values of minority carrier lifetime in region 4, with the remaining parameters held constant.

There is shown in FIG. 1 a silicon thyristor constructed in accordance with the invention. For clarity, the usual oxide layers are not shown. There is provided a thin silicon wafer 2 forming an n-type substrate of high resistivity, 50 ohm-cm (i.e. a low conductivity of 0.02 (ohm-cm)$^{-1}$). This wafer has an initial width of about 3 mils (75 microns). Using monolithic diffusion techniques, a selective two-sided p-diffusion is performed. In this particular case, the diffusion was performed for 1 hour at 900° C followed by a 1200° C drive-in diffusion for 1½ hours to yield an n-type region 4 having a width of about 61 microns sandwiched between a pair of p-type regions 6 and 8 having widths of about 7 microns. This is followed by an n-diffusion in region 8 at 1020° C for 1 hour to yield an n-type region 10 having a width of about 2 microns and a p-type region 12 having a width of about 5 microns. It is thus seen that there is provided a silicon thyristor having alternate conductivity type layers forming a PNP transistor with a physical base width of about 61 microns and an NPN transistor with a physical base width of about 5 microns.

The times, temperatures, etc. noted in the above-described diffusion operations are not critical and may be varied; furthermore, while diffusion operations have been described, it is within the scope of the present invention to employ any other type of operation which yields the proper geometry (e.g. layer width), doping (resistivity or conductivity) and carrier lifetime, as will be more fully described hereinafter; some examples of such other operations are epitaxial growth, alloying. and ion implantation techniques.

Contacts are made by attaching electrodes 14 and 15 to metalizations 16 and 17 formed on regions 6 and 10, respectively.

Application of a forward blocking voltge across the device, i.e. a positive potential to electrode 14 with respect to electrode 15, reduces the electrical base widths due to the creation of depletion regions around the junctions, as explained in said Jaskolski et al. Patent. Thus, application of forward voltage reduces the electrical widths of regions 4 and 12, thus permitting very high base transport factors.

Figure 11:
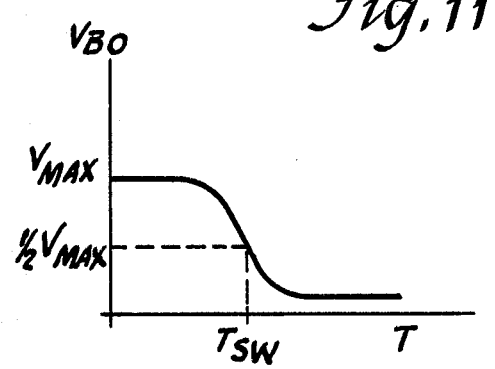
FIG. 11 is a graph of breakover voltage versus temperature, illustrating the temperature dependence of the breakover voltage of a switch constructed in accordance with the invention.

There is shown in FIG. 11 a graph of breakover voltage, $V_{BO}$, versus temperature, T. Defining the switching temperature, $T_{sw}$, as that temperature at which the breakover voltage is one half its maximum value, a device has been constructed in accordance with FIG. 1 having a switching temperature of −18° C, heretofore thought unobtainable in a silicon thyristor. Freezer chests are commonly maintained at −18° C and hence constitute one use of such a switch.

Base width is a dominant factor affecting the switching temperature of the above-described thyristor. Other factors such as doping (resistivity) and carrier lifetime also effect the switching temperature. For example, starting with another 3 mil wafer, another thyristor has been built comparably to the above-described thyristor, but having a switching temperature of −10° C. Still another thyristor, starting with an initial wafer width of 3 mils, has exhibited a switching temperature of −5° C. Starting with a wafer width of 8 mils, other thyristors have been built which switch at 55° C and 70° C, thus showing the drastic increase in switching temperature with increased width. Another thyristor, with an initial wafer width of 7 mils, switched at 30° C. Epitaxial techniques yielded thyristors switching at 102° and 150° C. The above reductions to practice show in a rough manner the relationship between geometry (e.g. base width) and switching temperature.

The nature of a more precise, quantitative relation between geometry and switching temperature can be best illustrated graphically. Furthermore, in addition to geometry, doping and carrier lifetime are also parameters which affect the switching temperature. The relationship between these parameters and their effect on switching characteristics can best be understood by reference to the schematic illustration of FIG. 2 and the accompanying graphs in FIGS. 3 to 7, wherein:

$P_1$ = region 1 = first emitter diffusion $N_2$ = region 2 = substrate and forms base region of PNP transistor $P_3$ = region 3 = diffused base of NPN transistor $N_4$ = region 4 = second emitter diffusion $X_{J1}$ = depth of region 4 = depth of junction J1 between regions 4 and 3

$X_{J2}$ = depth of region 3 = depth of junction J2 between regions 3 and 2

$X_{J3}$ = depth of region 1 = depth of junction J3 between regions 1 and 2

$W_2$ = width in microns of electrical base region 2 of PNP transistor $W_3$ = width in microns of electrical base region 3 of NPN transistor $\rho_2$ = resistivity in ohm-cm of base region 2

$\rho_3$ = resistivity in ohm-cm of base region 3

$\tau_2$ = lifetime in seconds of minority carriers in $N_2$ substrate, region 2

$\tau_3$ = lifetime in seconds of minority carriers in the diffused base of the NPN transistor, region 3

$\tau_4$ = lifetime in seconds of minority carriers in the second diffused emitter, region 4

$\tau_{J2} = (\tau_2 \cdot \tau_3)^{\frac{1}{2}}$ = effective lifetime in the space charge region associated with junction $J_2$.

$\tau_{J1} = (\tau_3 \cdot \tau_4)^{\frac{1}{2}}$ = effective lifetime in the space charge region associated with junction $J_1$.

$T_{sw}$ = value of switching temperature in degrees centigrade resulting in forward blocking voltages one half their maximum value.

Using the device shown in FIG. 2 as a model, these graphs teach how to build a temperature sensitive silicon thyristor thermally actuatable to intrinsically switch between high and low resistance states in response to a predetermined switching temperature as low as −30° C by illustrating how the temperature responsive intrinsic switching characteristics of a silicon thyristor vary with the parameters of geometry, doping and carrier lifetime. It is thus seen that the present invention affords silicon thyristors having intrinsic switching temperatures not only lower than heretofore achieved but also predictably determinable.

There is shown in FIG. 3 a graph of $W_2$ versus $T_{sw}$ for four different values of $\tau_4$, with $W_3$, $\rho_3$, $\rho_2$, $\tau_2$ and $\tau_3$ held constant. It is thus seen that the switching temperature, $T_{sw}$, can be controlled by varying the width of the base region 2, $W_2$; the smaller the base width, the lower the switching temperature. It is also seen that the switching temperature varies with the minority carrier lifetime in the emitter region 4, $\tau_4$; the longer the lifetime, the lower switching temperature. Using the graph, a switching temperature is predetermined by the corresponding combination of parameters. For example, a thyristor having a switching temperature of 0° C, could have an electrical base width $W_2$ equal to 17 microns and a minority carrier lifetime $\tau_4$ equal to $10^{-7}$ seconds, assuming the values of $W_3$, $\rho_3$, $\rho_2$, $\tau_2$ and $\tau_3$ are as noted in FIG. 3. Alternatively, for a 0° C switch, $W_2$ could equal 10 microns and $\tau_4$ equal $10^{-8}$ seconds; or $W_2$ could equal 8 microns and $\tau_4$ equal $10^{-9}$ seconds; or $W_2$ could equal 6.5 microns and $\tau_4$ equal $10-10$ seconds. Other values of switching temperature are obtainable as shown in the graph.

Figure 4:
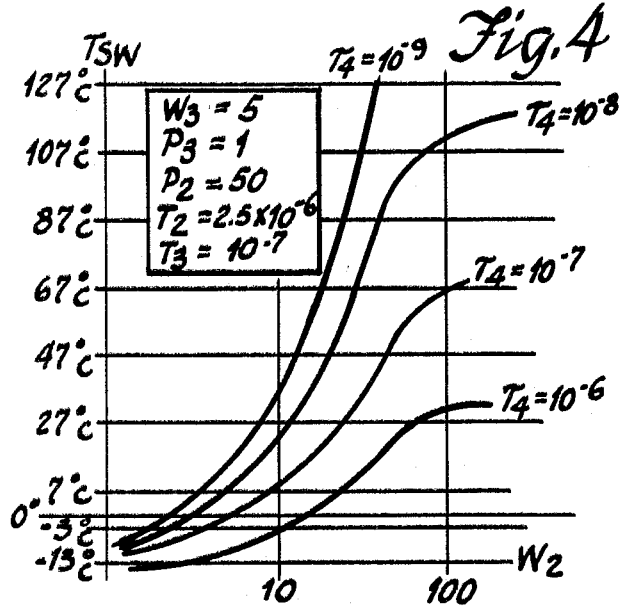
FIG. 4 is a graph like FIG. 3 except having a different constant value for the minority carrier lifetime in region 3 of the switch of FIG. 2.

FIG. 4 is similar to FIG. 3 except that the minority carrier lifetime in base region 3, $\tau_3$, has been changed to a different constant value, $10^{-7}$ seconds. Comparing FIGS. 3 and 4 shows the resultant effect upon switching temperature due to a variation in the minority carrier lifetime in the base region 3.

Figure 5:
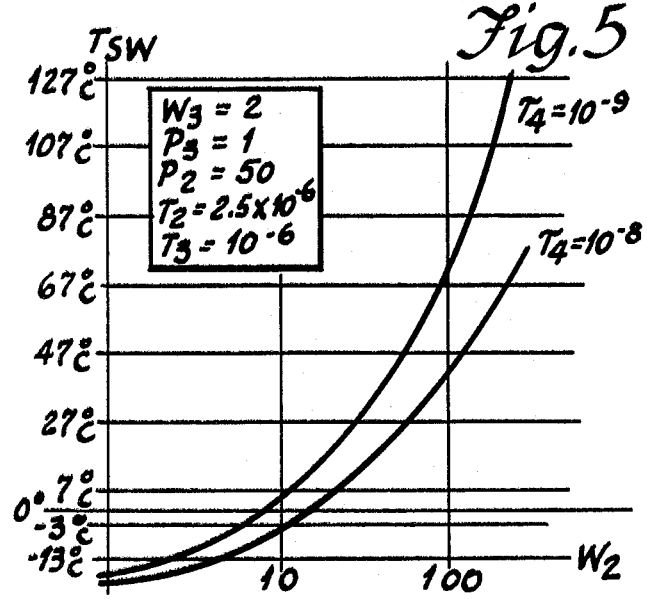
FIG. 5 is a graph like FIG. 3 except having a different constant value for the electrical width of region 3 of the switch of FIG. 2, and showning two values for the minority carrier lifetime in region 4.

FIG. 5 is similar to FIG. 3 except that curves are shown for only two values of $\tau_4$, and $W_3$ has been changed to a different constant value, 2 microns. There is thus shown, when compared to FIG. 3, the effect upon switching temperature of a reduced electrical width of base region 3.

Figure 6:
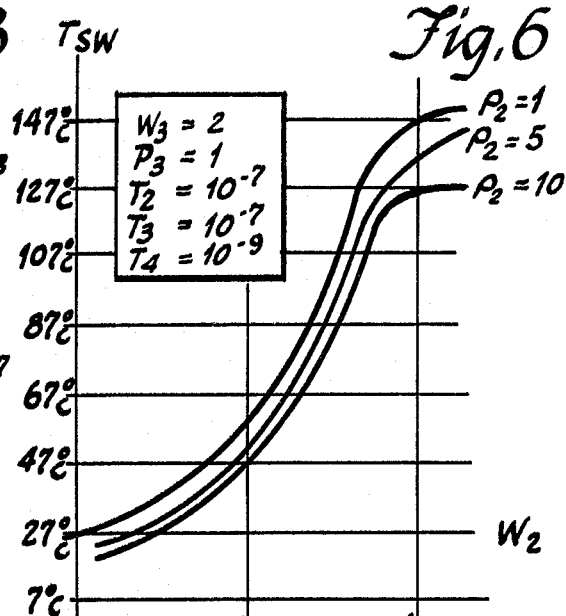
FIG. 6 is a graph showing the variation in switching temperature of the switch of FIG. 2 with respect to electrical width of region 2 therein for three different values of resistivity of region 2, with the remaining parameters held constant.

FIG. 6 is a graph of $W_2$ versus $T_{sw}$ for three different values of $\rho_2$, with $\rho_3$, $W_3$, $\tau_3$ and $\tau_4$ held constant. This graph illustrates not only the base width dependence of the switching temperature, as in FIGS. 3–5, but also the base resistivity dependence of the switching temperature. It is thus shown that the greater the resistivity of base region 2, the lower the switching temperature.

Figure 7:
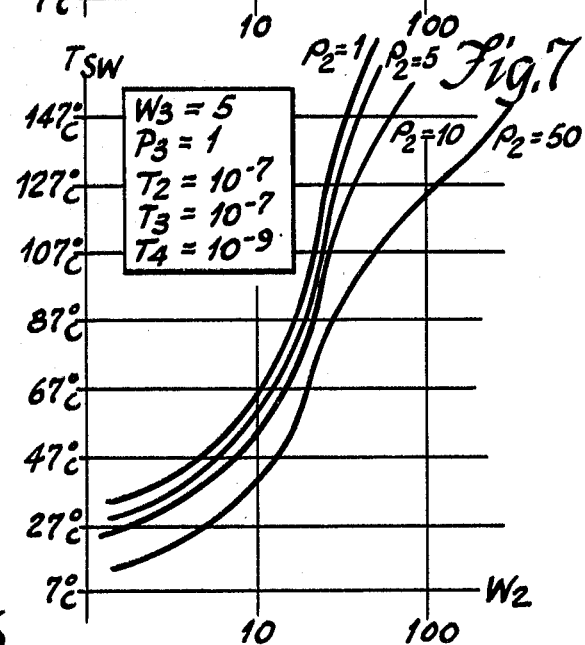
FIG. 7 is a graph like FIG. 6 except having a different constant value for the electrical width of region 3 of the switch of FIG. 2, and having an additional value for resistivity of region 2 (which is the same value of resistivity of region 2 held constant in the graphs in FIGS. 3-5).

FIG. 7 is similar to FIG. 6 except that another curve has been added for a fourth value of $\rho_2$ (which is the same value used for $\rho_2$ in FIGS. 3–5) and $W_3$ has been changed to a different constant value, 5 microns.

While the graphs disclose with particularity the details of the present invention, a summary of the graphs taken compositely may enhance the teachings contained herein and ellucidate an overview of the various parameters affecting the switching temperature.

The widths of the outer layers are non-critical and hence are not plotted. The electrical widths of the middle or base layers, $W_2$ and $W_3$, must generally be less than about 5 mils (125 microns) as seen on the graphs; widths greater than this are not amenable to low temperature switching. There is no lower limit on the base widths because as the width is made smaller, the base transport efficiency approaches unity.

The conductivities of the base regions, $\rho_2$ and $\rho_3$, are seen to range from 1 to 50 ohm-cm; a value as low as about 0.1 ohm-cm is permissible. The resistivities of the outer layers are not plotted because they are determined in a relative manner by the middle layer (base region) resistivities, i.e. referring to FIG. 2, the resistivity of emitter region 1, $\rho_1$, should be less than the resistivity of base region 2, $\rho_2$, and the resistivity of emitter region 4, $\rho_4$, should be less than the resistivity of base region 3, $\rho_3$, to afford high intrinsic injection efficiency.

For the purpose of presenting the aforementioned graphs, minority carrier lifetime in the base region 2, $\tau_2$, is shown to range from $10^{-7}$ to $2.5 \times 10^{-6}$ seconds; the minority carrier lifetime in the base region 3, $\tau_3$, is shown to range from $10^{-7}$ to $10^{-6}$ seconds; and the minority carrier lifetime in the emitter region 4, $\tau_4$, is shown to range from $10^{-10}$ to $10^{-6}$ seconds. $\tau_2$ should generally be greater than about $10^{-9}$ seconds and, as seen when the graphs are compared, $\tau_3$ and $\tau_4$ are normally less than or equal to $\tau_2$. Also, the minority carrier lifetime in emitter region 1, $\tau_1$, is normally less than or equal to $\tau_2$. Thus, $\tau_1$, $\tau_3$ and $\tau_4$ are determined in a relative manner with respect to $\tau_2$.

There is shown in FIG. 8 an alternate embodiment of the present invention providing a bilateral semiconductor temperature responsive switch wherein the right side is an inversion of the left side, the left side being like that shown in FIG. 1 and having a common n-type substrate 18 therewith. A pair of spaced two-sided p-diffusions yield p-type regions 20, 22, 24 and 26. n-diffusions yield diagonally opposite n-regions 28 and 30. A conductor 32 bridges regions 30 and 20 by means of metallizations 34 and 36. A conductor 38 similarly bridges regions 24 and 28. Electrodes 40 and 42 are attached to the conductors.

There is thus formed a pair of juxtaposed antiparallel four layer silicon devices, one NPNP and the other PNPN, thereby providing a bilateral switch connectable to an A.C. power source. The parameters of base width, doping, and carrier lifetime may be varied as before to attain desired switching temperatures.

It is further within the scope of the present invention to include the various types of basic control circuitry, together with alternate device configurations and/or additional electrodes, where appropriate, for the aforedescribed switches which may further control or adjust their switching temperature whereby a consistent, predictable value of switching temperature may be selectably predetermined by use of said circuitry and/or variation of said parameters.

For example, there is shown in FIGS. 9 and 10 a cathode gated switch 43 and circuit application therefore, wherein reference characters like those in FIG. 1 are used to facilitate identification of parts. An additional electrode 44 is connected to layer 8 by means of metallization 46 and may be used to apply a voltage so that the potential difference which occurs across the junction between regions 8 and 10 is controlled. If layer 8 is held more negative with respect to layer 10, the current through the junction is reduced and the switching temperature for this device is increased. On the other hand, if layer 8 is made more positive with respect to layer 10, the current through the junction increases and the switching temperature for the device is decreased. It is also seen that a variable resistor 48 may be connected across the gate terminal 44 and the cathode 15 to increase $T_{sw}$. It will be appreciated by those skilled in the art that many other circuit means are adaptable for use with the thyristor disclosed hereby. These circuit means can include external circuitry, alternate device configurations or additional electrodes, etc., whereby to further control and vary the switching temperature. Some examples of such circuit means are those disclosed in said Jaskolski et al. Patent incorporated herein by reference.

By way of summary, the present invention encompasses a silicon thyristor exhibiting enhanced thermal sensitivity. It is seen that the temperature dependence of the breakover voltage is manifested at temperatures lower than heretofore exhibited or thought possible. Furthermore, by relating the various parameters affecting this temperature dependence, it is shown how the temperature at which the thyristor switches between high and low resistance states is a function of geometry, doping and carrier lifetime whereby to render the switching temperature predictably determinalbe. Not only is thermal sensitivity increased but also predictably increased.

Thermal sensitivity may be enhanced by increasing base transport efficiency and/or intrinsic injection efficiency such that the sum of the products $\gamma \cdot \beta$ for each transistor comprising the thyristor exceeds unity at a low temperature, whereupon the thyristor switches. Base transport efficiency is a function of the ratio of base width to diffusion length, wherein diffusion length is a function of minority carrier lifetime. Injection efficiency is a function of the ratio of base resistivity to emitter resistivity. Switching temperature is thus a function of geometry, doping and carrier lifetime; more specifically, the switching temperature is an increasing function of base widths and of emitter resistivities, and a decreasing function of base resistivities and of minority carrier lifetimes. In the context of the embodiment dislcosed in FIGS. 2–7 $T_{sw}$ is an increasing function of $W_2$, $W_3$, $\rho_1$ and $\rho_4$, and a decreasing function of $\rho_2$, $\rho_3$, $\tau_1$, $\tau_2$, $\tau_3$ and $\tau_4$.

It is to be noted that the scope of the present invention is not intended to be limited to the values of base widths, resistivities and carrier lifetimes given therein but is more properly defined in terms of the relative values thereof, as aforenoted.

As used in the appended claims: "on the order of" shall mean within a power of 10, e.g. "on the order of $10^5$" means a value having a lower limit of $0.1 \times 10^5$ and an upper limit of $10 \times 10^5$; "nominally" indicates an average value which may vary within the bounds of experimental accuracy.

We claim:

1. A silicon thyristor comprising a bistable semiconductor device comprising three junctions of opposite conductivity type silicon, said thyristor having a plurality of middle regions disposed between two end regions, each said end region having a terminal connected thereto, said thyristor having a low current, high resistance OFF state and a high current, low resistance ON state between said terminals, said thyristor having a two terminal breakover voltage defined as the magnitude of voltage required to be applied across said terminals, without any bias applied to any of said middle regions, to cause said thyristor to switch from said OFF state to said ON state, said two terminal breakover voltage exhibiting thermal dependency at low temperature such that said two terminal breakover voltage is nominally equal to one-half Vmax at a temperature less than 50° C, where Vmax is defined as the maximum value of said two terminal breakover voltage of said thyristor with respect to temperature.

2. A silicon thyristor according to claim 1 wherein said thermally dependent two terminal breakover voltage is substantially equal to one-half Vmax at a temperature less than 40° C.

3. A silicon thyristor according to claim 2 wherein said thermally dependent two terminal breakover voltage is substantially equal to one-half Vmax at a temperature less than 30° C.

4. A silicon thyristor according to claim 3 wherein said thermally dependent two terminal voltage is substantially equal to one-half Vmax at a temperature less than 20° C.

5. A silicon thyristor according to claim 4 wherein said thermally dependent two terminal breakover voltage is substantially equal to one-half Vmax at a temperature less than 10° C.

6. A silicon thyristor according to claim 5 wherein said thermally dependent two terminal breakover voltage is substantially equal to one-half Vmax at a temperature less than 0° C.

7. A silicon thyristor according to claim 6 wherein said thermally dependent breakover voltage is substantially equal to one-half Vmax at a temperature less than minus 10° C.

8. A silicon thyristor according to claim 1 employing two narrow base regions to enhance thermal sensitivity and comprising first, second, third and fourth consecutive regions of alternating conductivity type silicon forming said three junctions, the first, second and third junctions, respectively, said second and third regions being said base regions;
said second region having an electrical width less than about 125 microns when a voltage equal to one-half V-max is applied across said thyristor, said electrical width of said second region being defined as the distance between depletion zones created around said first and said second junctions when one-half Vmax is applied across said thyristor;
said third region having an electrical width less than about 15 microns when a voltage equal to one-half Vmax is applied across said thyristor, said electrical width of said third region being defined as the distance between depletion zones created around said second and said third junctions when one-half Vmax is applied across said thyristor.

9. A silicon thyristor according to claim 8 wherein:
said second region has a resistivity greater than about $10^{-1}$ ohm-cm, and a minority carrier lifetime greater than about $10^{-9}$ seconds;
said third region has a resistivity greater than about $10^{-1}$ ohm-cm;
said fourth region has a resistivity less than said resistivity of said third region; and
said first region has a resistivity less than said resistivity of said second region.

10. A silicon thyristor according to claim 9 wherein:
the minority carrier lifetimes fo said first, third and fourth regions are each less than or equal to said minority carrier lifetime of said second region; and
said resistivity of said third region is less than or equal to said resistivity of said second region.

11. A silicon thyristor according to claim 8 wherein said electrical width of said third region is less than about 10 microns.

12. A silicon thyristor according to claim 11 wherein said electrical width of said third region is less than about 5 microns.

13. A silicon thyristor according to claim 8 wherein said regions are axially aligned in a substrate, said first and said fourth regions being disposed on opposite planar surfaces of said substrate.

14. A silicon thyristor comprising first, second, third and fourth consecutive regions of alternating conductivity type silicon forming first, second and third PN junctions, respectively;
said second region having an electrical width nominally $W_2$ defined as the distance between depletion zones created around said first and second junctions when a reference voltage is applied across said thyristor;
said second region having a resistivity nominally $\rho 2$;
said second region having a minority carrier lifetime on the order of $\tau 2$;
said third region having an electrical width nominally $W_3$ defined as the distance between depletion zones created around said second and said third junctions when said reference voltage is applied across said thyristor;
said third region having a resistivity nominally $\rho 3$;
said third region having a minority carrier lifetime on the order of $\tau 3$;
said fourth region having a minority carrier lifetime on the order of $\tau 4$;
said reference voltage being defined as one-half the maximum breakover voltage of said thyristor with respect to temperature;
said thyristor being thermally actuatable to intrinsically switch between high and low resistance states in response to a switching temperature, $T_{sw}$, predictably determined by an appropriate combination of values for the parameters of widths, resistivities and lifetimes $W_2$, $W_3$, $\rho_2$, $\rho_3$, $T_2$ $T_3$, as shown in FIGS. 3 through 7, $T_{sw}$ being defined as that temperature at which the two terminal thermally dependent anode to cathode breakover voltage of said thyristor equals said reference voltage.

* * * * *